(12) United States Patent
Melvin et al.

(10) Patent No.: US 6,608,445 B2
(45) Date of Patent: Aug. 19, 2003

(54) EFFICIENT SOLID STATE SWITCHING AND CONTROL SYSTEM FOR RETRACTABLE AIRCRAFT LANDING LIGHTS

(75) Inventors: Duane F. Melvin, Dayton, OH (US); Saed M. Mubaslat, Miamisburg, OH (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/154,375

(22) Filed: May 23, 2002

(65) Prior Publication Data

US 2003/0107322 A1 Jun. 12, 2003

Related U.S. Application Data

(60) Provisional application No. 60/339,637, filed on Dec. 12, 2001.

(51) Int. Cl.[7] .............................. B60Q 1/02; G02B 27/00
(52) U.S. Cl. .......................... 315/82; 250/551; 307/311
(58) Field of Search .......................... 315/82, 307, 308, 315/224, 226, 291; 250/551; 307/270, 311

(56) References Cited

U.S. PATENT DOCUMENTS

| | | | |
|---|---|---|---|
| 4,295,058 A | 10/1981 | Lade et al. | 307/252 |
| 4,390,790 A | 6/1983 | Rodriguez | 250/551 |
| 4,611,123 A | 9/1986 | McDonald | 250/551 |
| 4,647,794 A | * 3/1987 | Guajardo | 307/311 |
| 4,665,316 A | 5/1987 | Hodges | 250/551 |
| 4,695,733 A | 9/1987 | Pesavento | 250/551 |
| 4,777,387 A | * 10/1988 | Collins | 307/270 |
| 4,902,901 A | 2/1990 | Pernyeszi | 250/551 |
| 5,146,100 A | * 9/1992 | Banaska | 250/551 |
| 5,278,422 A | * 1/1994 | Kato et al. | 250/551 |
| 5,488,552 A | 1/1996 | Sakamoto et al. | 363/21 |
| 5,612,582 A | 3/1997 | Shichi et al. | 307/130 |
| 5,677,833 A | 10/1997 | Bingley | 363/71 |
| 5,719,474 A | 2/1998 | Vitello | 315/307 |
| 5,747,967 A | 5/1998 | Muljadi et al. | 320/39 |
| RE35,836 E | 7/1998 | Rodriguez | 250/551 |
| 5,896,281 A | 4/1999 | Bingley | 363/71 |
| 2001/0041478 A1 | 11/2001 | Matsuura | 439/625 |

* cited by examiner

*Primary Examiner*—Hoang Nguyen
(74) *Attorney, Agent, or Firm*—Larry J. Palguta

(57) ABSTRACT

A solid state control switching and control system (200) for retractable landing lights. A control unit (208) uses an absolute position sensor (214) to monitor the position of the lighthead (210) of the retractable landing light, and actuates a motor (216), brake (217), and lamp (212) in response to command signals (220,221,223) from the flight crew. Actuation of the motor (216), brake (217), and lamp (212) with solid state switches (100) is gradual and synchronized to minimize electromagnetic interference and extend component life.

19 Claims, 3 Drawing Sheets

EFFICIENT SOLID STATE SWITCHING AND CONTROL SYSTEM FOR RETRACTABLE AIRCRAFT LANDING LIGHTS

CROSS REFERENCE

This application is related to a copending application Ser. No. 10/153,945 entitled "Electronically Controlled Aircraft Retractable Landing Light With Manual Retraction Capability," by inventors S. Hamilton, S. Mubaslat, B. Barnhart, and C. Giffen.

BACKGROUND OF THE INVENTION

This application claims the benefit of U.S. Provisional Application No. 60/339637 filed Dec. 12, 2001 entitled EFFICIENT AC/DC SOLID STATE SWITCHING SYSTEM FOR AIRCRAFT LANDING LIGHTS.

1. Field of the Invention

This invention relates to a switching and control system for an aircraft retractable landing light. Specifically, this invention relates to a switching and control system for an aircraft retractable landing light having solid state AC/DC switching and improved load control.

2. Description of the Related Art

Landing lights are mounted to aircraft to illuminate areas forward of the aircraft during night operations on taxiways and runways. A "retractable landing light" is a remotely controlled, articulating light that can be stowed flush with the outside surface of the aircraft when not in use, reducing aerodynamic drag on the aircraft. The retractable landing light's lamp is housed in a lighthead. The lighthead is in turn hingedly affixed to a housing assembly, which is mounted to the airframe. The lighthead is typically extended for use and retracted to a stowed position by means of a transmission mechanism driven by an electric motor, and held in place by an electromechanical brake. When the flight crew actuates a remote control to the "Extend" position, the brake is released by applying electrical power to the brake's coil. Electrical power is simultaneously applied to the motor, causing the motor's output shaft to turn, driving the transmission. The lighthead then extends to a predetermined position in conformance with the remote control, aiming the lamp to illuminate areas forward of the aircraft. Power is then removed from the motor and the brake, causing the lighthead to stop moving. The brake re-engages, holding the lighthead in position against the force of the windstream. The motor and brake are also simultaneously activated when the remote control is placed in the "Retract" position. However, power is applied to the motor so as to cause the motor's output shaft to rotate counter to the direction used to extend the lighthead. Once the lighthead is flush with the surface of the aircraft, power is removed simultaneously from the motor and brake, holding the lighthead in the stowed position. The lamp may be automatically switched on by means of a limit switch after the lighthead is extended and then switched off when the lighthead is retracted. Alternatively, the lamp may be manually controlled by a switch in the cockpit.

Prior retractable landing lights suffer from a number of shortcomings. In particular, prior retractable landing lights utilize electromechanical relays for control of the motor, brake, and lamp. These relays have limited operational life due to wearing of the mechanical movement. In addition, the relays generate electromagnetic interference due to arcing at the relay contacts when switching inductive loads such as the motor and brake, and when switching loads with high inrush currents, such as incandescent lamps. This relay contact arcing also further reduces the operational life of the relays. Another disadvantage of electromechanical relays is that current flow through the motor, brake and lamp is limited only by the capacity of the aircraft's electrical system and wiring. This places significant stress on the relay contacts, motor, brake, and lamp, causing these components to suffer reduced service life.

The action of the motor, brake, and lamp relays is controlled by mechanical limit switches and actuators in prior retractable landing lights. The limit switches and actuators make synchronization of motor, brake, and lamp functions cumbersome. As a consequence the motor and brake are switched on and off simultaneously. The lamp may also be switched on and off at the same time. This causes large, sudden load swings in the aircraft's electrical system, resulting in electrical switching transients and electromagnetic interference that may disrupt or damage other equipment connected to the electrical system. Synchronization of the power applied to the motor, brake, and lamp is desirable to minimize switching transients and electromagnetic emissions. For example, the brake coil should be energized to release the brake prior to energizing the motor, and should be de-energized after removing power to the motor. The lamp should be switched on and off only when power has been removed from both the motor and the brake.

"Soft starting" of loads with high inrush current characteristics to extend component life is not new. For example, Hamilton U.S. Pat. No. 6,315,435, teaches the use of solid-state switches to reduce the inrush current to a lamp. However, Hamilton does not teach the use of synchronization and controlled turn-off of loads in addition to controlled turn-on. Hamilton also does not teach a solid state switch capable of switching either AC or DC electrical loads with galvanically isolated control logic. The use of optically coupled solid state switches for electrical power control is also well known, as shown in Rodriguez, U.S. Pat. Nos. Re. 35,836 and 4,390,790, Shichi et al. U.S. Pat. No. 5,612,582, Hodges U.S. Pat. No. 4,665,316, Pernyeszi U.S. Pat. No. 4,902,901, and McDonald U.S. Pat. No. 4,611,123. However, the prior art concentrates on achieving the faster turn-on and turn-off speeds desired for many switching applications rather than utilizing and enhancing the inherently slower switching characteristics of optically coupled field effect transistors to achieve synchronized, "soft" switching of multiple loads.

The landing light is a required item for night aircraft operations, and must be kept in good working order. Additionally, maintenance of the landing light is expensive and time-consuming. There is a need for a more reliable switching and control system for retractable landing lights.

SUMMARY OF THE INVENTION

This invention is directed to an efficient solid state switching and control system for aircraft retractable landing lights. The solid state switching and control system has "soft" turn-on and turn-off capability, hysteresis, and feedback to reduce stress on switching components, reduce electromagnetic interference, and extend the service life of the retractable landing light.

Specifically, the present invention includes solid state switches comprising back-to-back N-channel Metal Oxide Semiconductor Field Effect Transistors ("MOSFETs") driven by photovoltaic optical drivers to provide galvanic isolation between the logic and power stages of the switching system. The combination of MOSFETS and photovoltaic optical drivers have an inherent "soft" switching characteristic, which provides for a slower turn-on and turn-off of the load than is possible with electromechanical relays. This characteristic is desirable, for example, for switching power to an incandescent lamp. The filaments of incandescent lamps exhibit a lower resistance when cool. As a result, when power is applied to an incandescent lamp, the lamp experiences an inrush of current that is much higher than its normal operating current, stressing the lamp's filament and reducing its operational life. Soft-starting the incandescent lamp limits the inrush current, thereby increasing the lamp's operational life. Controlled turn-off, coupled with soft starting, can also be beneficially applied to the retractable landing light's motor and brake. A controlled turn-on and turn-off of the motor and motor brake acts to minimize the inductive energy generated by the motor and brake, resulting in improved component life and reduced electromagnetic emissions. If a cockpit-mounted indicator is employed to notify the flight crew when the lighthead is extended, soft-switching may also be used to extend the operational life of the indicator. Galvanic isolation of the logic stage of the present switching and control system facilitates control of either highlevel AC or high-level DC voltages, permitting the use of AC or DC motors, brakes, lamps, and indicators or a combination of AC and DC motors, brakes, lamps, and indicators. For example, it may be convenient to power the motor and brake from a relatively low-power DC aircraft electrical supply, but power the high-current lamp from a more robust AC aircraft electrical supply.

The solid state switches in the present invention may be coupled with feedback means, providing the logic stage with status information on the switched load. The logic circuit, acting in combination with the inherent soft-start and soft-stop characteristics of the solid state switches, provides hysteresis to stagger switching of the lamp, motor, and brake. This "synchronized switching" reduces electromagnetic emissions, prevents shoot-through currents that can reduce the life of totem-pole switching components, and minimizes load-switching transients in the aircraft electrical system.

The present invention comprises a solid state switching system for a vehicle retractable light, comprising: means for controlling position of a lighthead and switching electrical power to a motor, motor brake, and lamp of the retractable light such that the power applied to said motor, motor brake, and lamp is gradually switched on and off; and solid state switches capable of switching high levels of AC or DC electrical voltage and current, said solid state switches comprising two N-Channel MOSFETs arranged in a series configuration such that a drain terminal of a first MOSFET is connected to electrical power, a drain terminal of a second MOSFET is connected to an electrical load to be switched, source terminals of said first and second MOSFETs are connected together, a photovoltaic generator is connected to gate terminals of said first and second MOSFETs, said photovoltaic generator providing a galvanically isolated current source to actuate said first and second MOSFETs when current is applied to light emitting diodes of said photovoltaic generator.

These and other features will become better understood with reference to the following description, appended claims, and accompanying drawings.

DETAILED DESCRIPTION OF THE INVENTION

Figure 1:
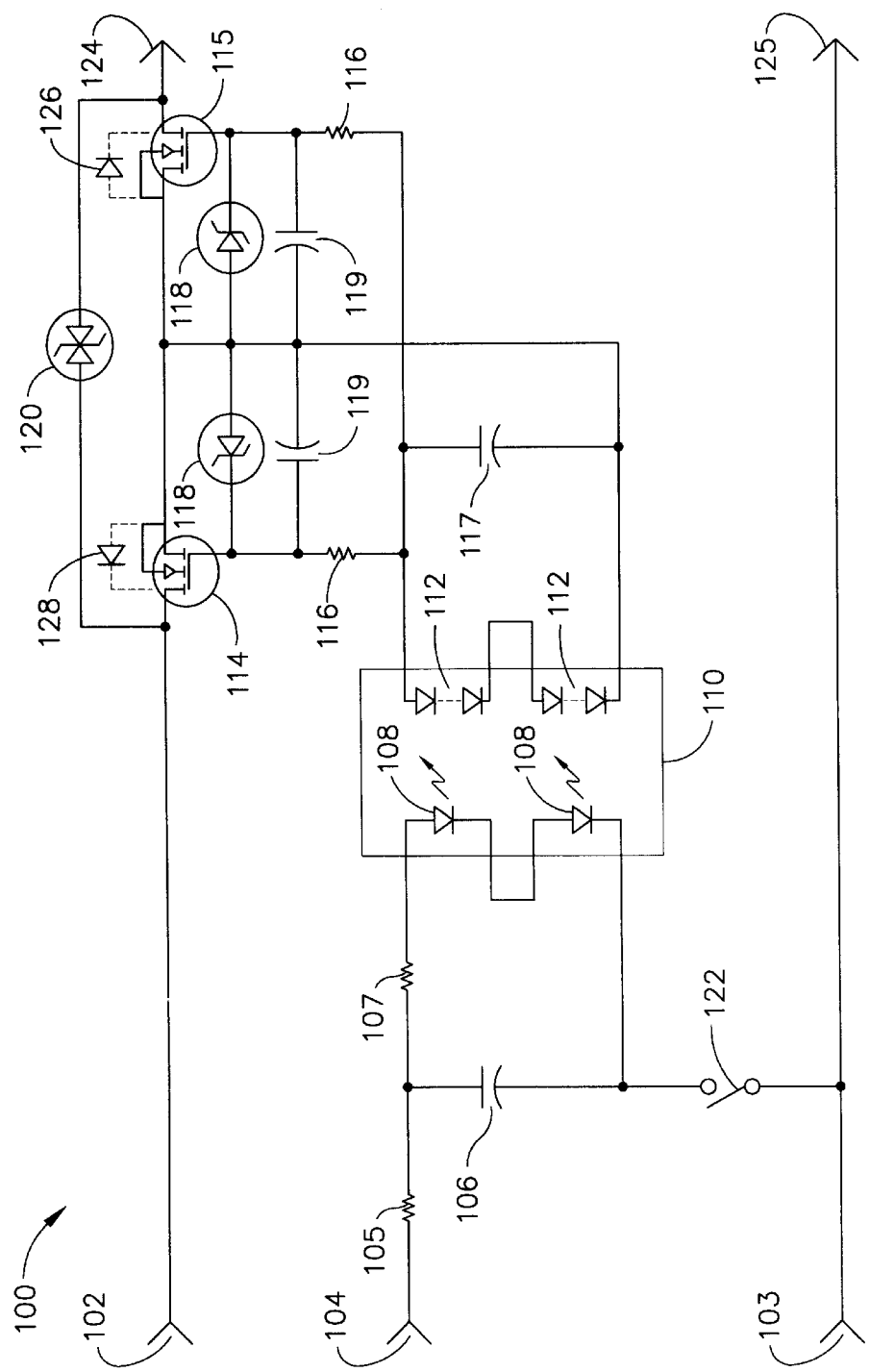
FIG. 1 is an electrical schematic diagram of the solid state switch.

An electrical schematic diagram of a solid state switch 100 is shown in FIG. 1. High-level electrical AC or DC power to be switched is applied to the input terminals 102,103. A logical control voltage is applied to an input terminal 104. The voltage at input terminal 104 is supplied to a resistor-capacitor "R-C" network 105,106, which is in turn connected to at least one light emitting diode 108 packaged within a photovoltaic isolator 110. A resistor 107 provides current limiting for the light emitting diodes 108. When a control switch 122 is closed, current gradually flows through the light emitting diodes 108 as capacitor 106 charges, causing the light emitting diodes 108 to radiate light. The light emitted by the light emitting diodes 108 is optically coupled to at least one photovoltaic generator 112 packaged within photovoltaic isolator 110, causing the photovoltaic generators 112 to generate a galvanically isolated current. The values of resistor 105 and capacitor 106 may be changed as desired to slow the turn-on and turn-off times of the light emitting diodes 108 when switch 122 is closed and opened respectively, resulting in a current generated by the photovoltaic isolators 112 with proportionally slow characteristics.

The current generated by the photovoltaic generators 112 is coupled to the gates of two N-Channel MOSFETS 114, 115 via a pair of gate bias resistors 116. This current gradually charges the inherent gate-to-source capacitance of the MOSFETS 114,115, causing the MOSFETS 114,115 to slowly begin conducting current to the load, which is connected to the output terminals 124,125. The gradual increase and decrease in the current generated by the photovoltaic isolators 112 combined with the gradual increase and decrease of the gate voltage of the MOSFETs 114,115 through the charging and discharging of the gate-to-source capacitance of the MOSFETs 114,115 results in a "soft switch," reducing electrical stress at turn-on and turn-off for both the MOSFETs 114,115 and loads such as the motor 216, brake 217, and lamp 212, shown in FIG. 2. This results in increased service life for the solid state switches 114,115 and a motor 216, brake 217, or lamp 212, while reducing electromagnetic emissions. The lagging on-off response time of the MOSFETS 114,115 associated with the gradual charging and discharging of the gate-to-source capacitance of the MOSFETS 114,115 also provides "hysteresis" means when the solid state switch 100 is part of a totem-pole or H-bridge power driver. This hysteresis prevents excessive currents and electromagnetic emissions that may occur when a voltage source is momentarily shorted to ground as a result of contention during switching of totem-pole or H-bridge power drivers. As previously discussed, the soft start and hysteresis characteristics inherent to the photovoltaic generators 112 and the MOSFETs 114,115 are augmented by means for gradually turning the light emitting diodes 108 on and off, such as with resistor 105 and capacitor 106. Varying the resistance of resistor 105 and the capacitance of capacitor 106 results in faster or slower turn-on and turn-off of the light emitting diodes 108, providing a means to adjust the amount of soft-switching control of solid state switch 100. The turn-on and turn-off time of the light emitting diodes 108 may be increased by increasing the R-C time constant of resistor 105 and capacitor 106. Conversely, the turn-on and turn-off time of the light emitting diodes 108 may be decreased by lowering the R-C time constant of resistor 105 and capacitor 106. The turn-on and turn-off time of the MOSFETs 114,115 may be further increased by adding a capacitor 117 to the photovoltaic generators 112. The turn-on and turn-off time of the MOSFETs 114,115 may also be increased by adding a pair of capacitors 119 to the gate drive circuits of the MOSFETs 114,115.

The low drain-to-source resistance inherent to the MOSFETS 114,115 when saturated minimizes $I^2R$ losses and resultant heat, making the solid state switch 100 an efficient switch for use with both AC and DC loads. MOSFETs 114,115 act as an electrical switch with galvanically isolated on-off control. When MOSFETs 114,115 are active, AC or DC current may flow from the drain terminals to the source terminals of the MOSFETs 114,115; electrical current may also flow from the source terminals to the drain terminals of the MOSFETs 114,115. The body diodes 126,128, which are integral to MOSFETs 114,115, serve to block the flow of electrical current through the solid state switch 100 when the MOSFETs 114,115 are in an off state.

Means for protecting the solid state switch 100 from transient voltages, such as a pair of zener diodes 118, may be placed in parallel with the gate and source terminals of the MOSFETs 114,115. Similarly, a protective device, such as a bipolar transorb 120, may be placed between the drain terminals of the MOSFETS 114,115 to provide protection from transient voltages.

In operation, an AC or DC power supply suitable for the retractable landing light's motor 216, brake 217, or lamp 212 is connected to the input terminals 102,103. Closing the switch 122 causes the MOSFETS 114,115 to turn "on," applying power to the load, such as a motor 216, brake 217, or lamp 212 connected to the output terminals 124,125. When switch 122 is opened, the MOSFETS 114,115 turn off, removing electrical power from the load. The switch 122 may be a manually operated switch, or may be an electronic switch actuated by a logical control.

Figure 2:
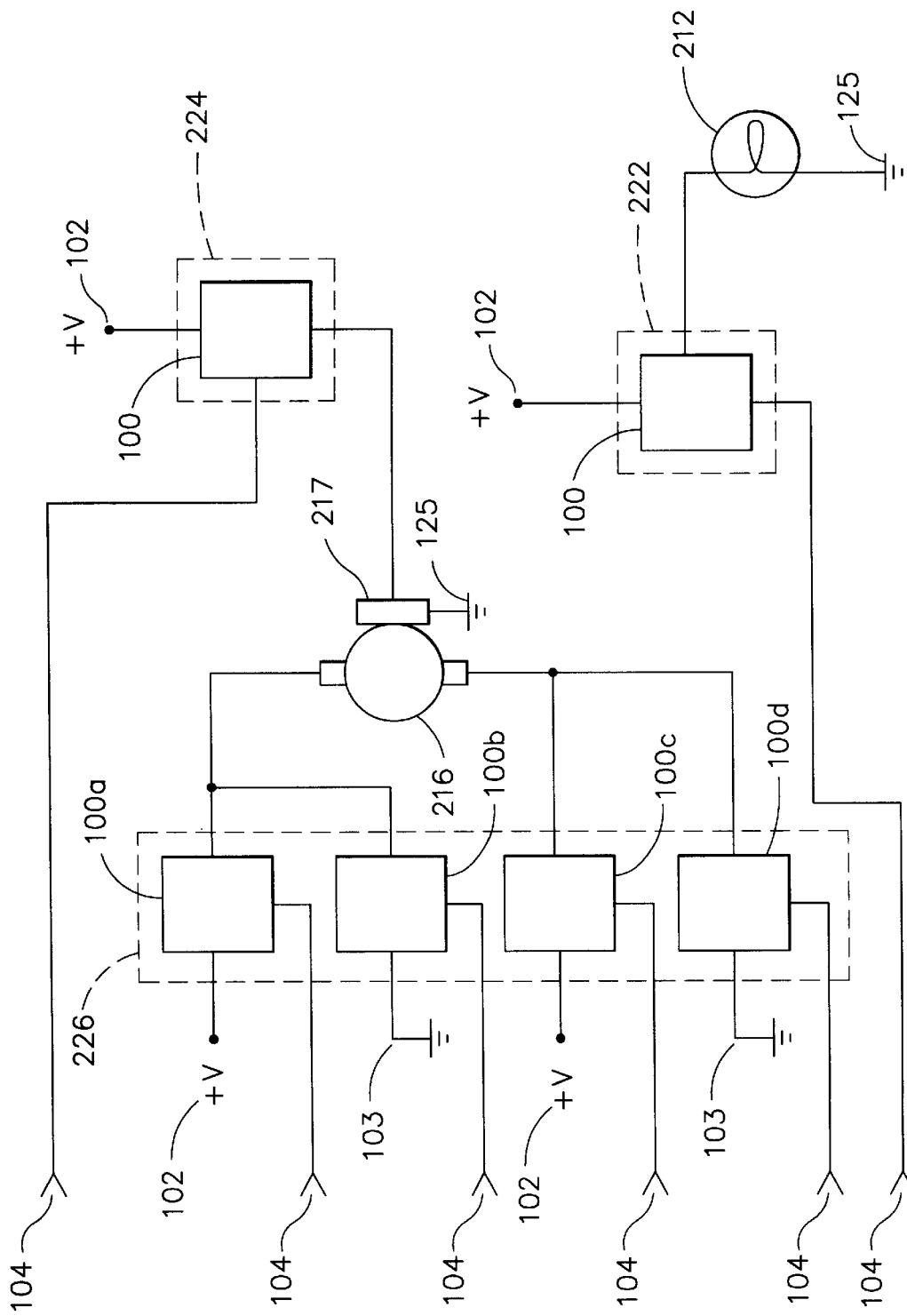
FIG. 2 is an electrical block diagram of the general arrangement of the solid state switch and associated loads.

An electrical block diagram of the general arrangement of the solid state switches 100 and associated loads is shown in FIG. 2. The lamp power driver circuit 222 and the brake power driver circuit 224 each utilize one solid state switch 100. If a DC-type motor is utilized, four solid state switches 100 may be arranged in an H-bridge configuration to form a motor power driver circuit 226. In this configuration solid state switches 100a and 100d are actuated to cause the output shaft of the motor 216 to rotate, for example, in a clockwise direction. The output shaft of the motor 216 may be caused to operate in the opposite direction, such as in a counter-clockwise direction, by actuating solid state switches 100b and 100c. The hysteresis prevents overlapping on-state time for solid state switch pairs 100a, 100b and 100c, 100d. Such an overlapping on-state time would result in a momentary short-circuit of the aircraft's power supply, potentially damaging the solid state switch pairs 100a, 100b and 100c, 100d, generating transients in the aircraft's electrical system. For an AC-type motor 216, separate solid state switches 100 may be utilized to supply power to one of separate clockwise and counter-clockwise motor windings.

Figure 3:
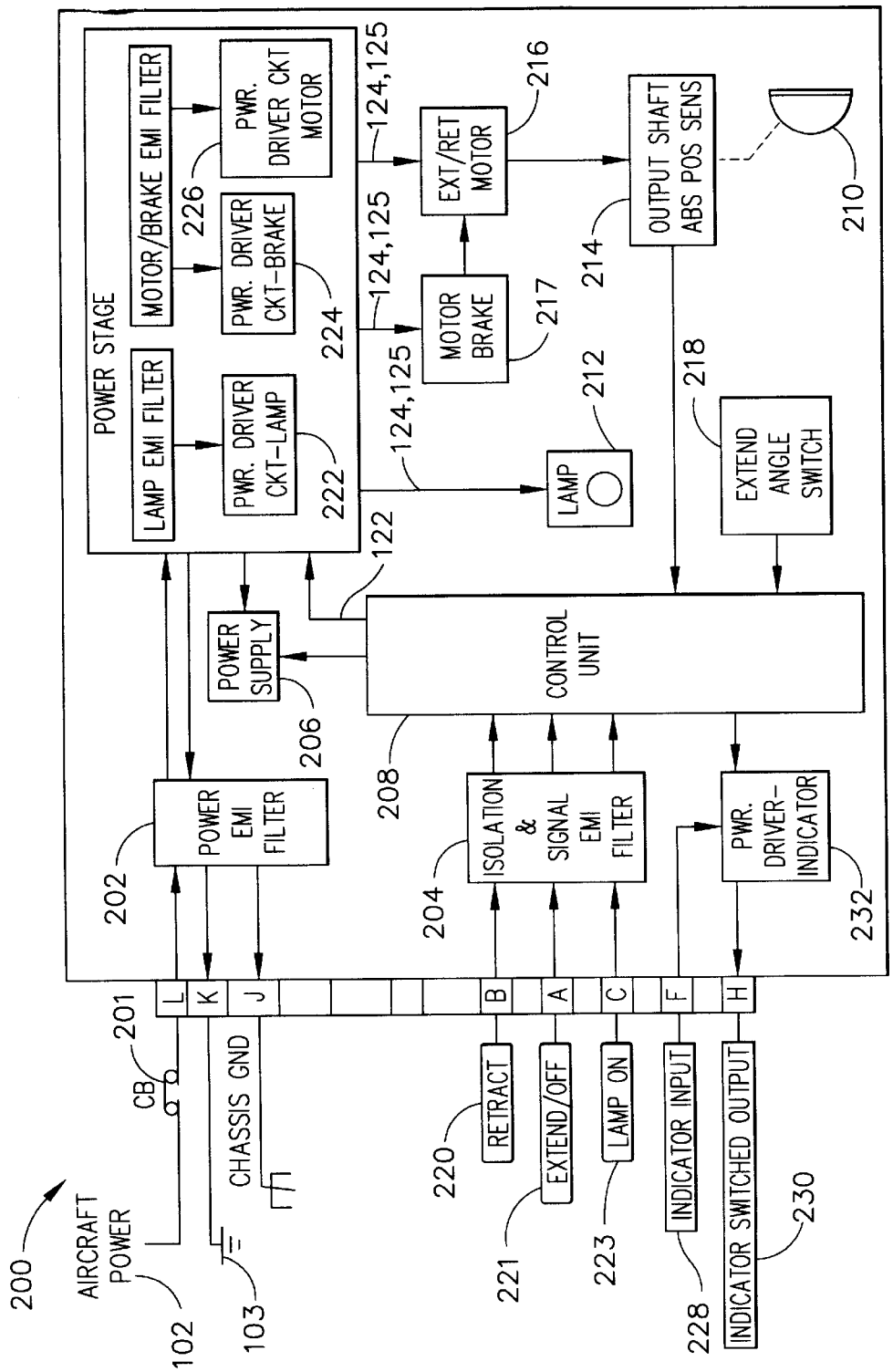
FIG. 3 is an electrical block diagram of the solid state switching and control system for an aircraft retractable landing light.

FIG. 3 shows an electrical block diagram of the solid state switching and control system 200 for an aircraft retractable landing light. Aircraft power is supplied to the power input terminals 102,103. A protective device, such as a circuit breaker 201, may be installed to protect the switching and control system 200 from electrical overload and short circuit conditions. The electrical filters 202 and 204 isolate electrical noise, such as electromagnetic interference, between the aircraft and the solid state switching and control system 200. The power supply 206, such as a voltage regulator, conditions electrical power from the aircraft to a level compatible with the control system 200. The position of the lighthead 210, containing the lamp 212, is sensed by an absolute position sensor 214. Means for controlling the position of the lighthead 210, such as a control unit 208, provides logic functions, such as for example, turning the lamp 212 on and off, control of power to the motor 216, braking of the motor 216 with the brake 217, the direction of rotation of the motor 216, resolution of the position of the lighthead 210, and fault protection. An extend angle switch 218 provides settings to the control unit 208 for positioning the lighthead 210 to a selected preset extension angle. The control unit 208 responds to the electrical command IS signals 220,221,223 and provides the ON-OFF control 122 for the power driver circuits 222,224,226. Power is connected to the lamp 212, the motor 216, and the brake 217 by the power driver circuits 222,224,226 via the outputs 124,125. Contactless means for monitoring the position of the lighthead 210, such as an absolute-type position sensor 214, for example a Hall-effect rotary position sensor, provides the control unit 208 with continuous information on the angular extension position of the lighthead 210 so that the control unit 208 can control the actuation of the motor 216, the direction of rotation of the motor 216, actuation of the brake 217, and illumination of the lamp 212 by appropriate synchronization of the on-off control of the power driver circuits 222,224,226. Incremental-type position encoders may alternatively be used, but absolute-type position encoders are preferred because absolute-type position encoders do not require periodic calibration to an index position. A cockpit-mounted indicator may be installed to notify the flight crew when the lighthead 210 is not retracted. AC or DC electrical power of a level convenient for the indicator may be connected to an indicator input 228. When the control unit 208 detects that the lighthead 210 is not retracted, control unit 208 actuates a solid state switch 232, providing a soft-switched electrical signal to an output 230. The cockpit indicator may be connected directly to output 230.

In operation, the flight crew commands the desired position for the retractable landing light by means of electrical signals 220,221,223. Alternatively, the electrical command signals 220,221,223 may be generated automatically, such as from an "air-ground" switch that senses whether or not the aircraft is in flight. When the control unit 208 receives a command signal 220,221,223, the control unit 208 compares the commanded operating mode and position of the lighthead 210 to the actual operating mode and position of the lighthead 210 by comparing the setting data provided by the extend angle switch 218 and the actual position of the lighthead 210, as indicated by the absolute position sensor 214. The control unit 208 then actuates the brake 217 just prior to actuating motor 216, causing the lighthead 210 to extend or retract as needed until the desired aiming position for the lamp 212 is reached. The control unit 208 removes power from the motor 216, then the brake 217. The control unit 208 also controls power to the lamp 212 in response to command signal 223, switching the lamp 212 on after the lighthead 210 is stopped in an extended position and switching the lamp 212 off before retracting the lighthead 210 to a stowed position. The brake 217 is actuated prior to actuating the motor 216, and is not deactivated until after power is removed from the motor 216. If the "Retract"

command signal 220 is active, the lamp 212 is switched off prior to actuating the brake 217, then the motor 216. If the "Lamp On" command signal 223 is active, the lamp 212 will not be activated until after power is first removed from the motor 216, then brake 217. Since power to the lamp 212, the motor 216, and the brake 217 are switched by the solid state switches 100 in a synchronized fashion, no mechanical wear, inrush currents, arcing, or inductive discharges occur that would reduce operational life of the motor 216, brake 217, or lamp 212, or generate excessive electromagnetic interference.

Additional photovoltaic isolators 110 may optionally be utilized to provide an electrically isolated current or voltage monitoring feedback to the control unit 208 for loads such as the lamp 212 or the motor 216.

What is claimed is:

1. A solid state switching system for a retractable vehicle light, comprising:
   means for controlling position of a lighthead and switching electrical power to a motor, motor brake, and lamp of the retractable light such that the power applied to said motor, motor brake, and lamp is gradually switched on and off; and
   solid state switches capable of switching high levels of AC or DC electrical voltage and current, said solid state switches comprising two N-Channel MOSFETs arranged in a series configuration such that a drain terminal of a first MOSFET is connected to electrical power, a drain terminal of a second MOSFET is connected to an electrical load to be switched, source terminals of said first and second MOSFETs are connected together, a photovoltaic generator is connected to gate terminals of said first and second MOSFETs, said photovoltaic generator providing a galvanically isolated current source to actuate said first and second MOSFETs when current is applied to light emitting diodes of said photovoltaic generator.

2. The solid state switching system of claim 1, further comprising contactless means for monitoring absolute position of said lighthead of the retractable light.

3. The solid state switching system of claim 1, further comprising at least one power supply to condition the electrical power from the vehicle to a level compatible with said control means.

4. The solid state switching system of claim 1, further comprising at least one electrical filter to isolate electromagnetic interference between the vehicle and the solid state switching system.

5. The solid state switching system of claim 1 wherein said motor brake is one of a dynamic and electromechanical brake.

6. The solid state switching system of claim 1 wherein said control means is one of a digital and analog control.

7. The solid state switching system of claim 1, further comprising means for gradually turning said light emitting diodes on and off to effect a gradual actuation and de-actuation of said solid state switches.

8. The solid state switching system of claim 1, wherein said control means switches said motor brake, motor, and lamp on and off in a synchronized fashion such that only one of said motor brake, motor, and lamp are switched on or off at any given time.

9. The solid state switching system of claim 1, wherein said solid state switch includes means for protecting said solid state switch from transient voltages.

10. The solid state switching system of claim 1, wherein said control means further switches electrical power to a cockpit-mounted indicator with one of said solid state switches such that power applied to said indicator is gradually switched on and off, said indicator alerting the vehicle crew when said lighthead is in an extended position.

11. The solid state switching system of claim 1, wherein said solid state switch further includes hysteresis means to prevent overlapping actuation of two or more solid state switches.

12. A solid state switching system for a retractable vehicle light, comprising:
   means for controlling position of a lighthead and switching electrical power to a motor, motor brake, and lamp of the retractable light such that the power applied to said motor, motor brake, and lamp is gradually switched on and off and said control means switches said motor brake, motor, and lamp on and off in a synchronized fashion such that only one of said motor brake, motor, and lamp are switched on or off at any given time;
   solid state switches capable of switching high levels of AC or DC electrical voltage and current, said solid state switches comprising two N-Channel MOSFETs arranged in a series configuration such that a drain terminal of a first MOSFET is connected to electrical power, a drain terminal of a second MOSFET is connected to an electrical load to be switched, source terminals of said first and second MOSFETs are connected together, a photovoltaic generator is connected to gate terminals of said first and second MOSFETs, said photovoltaic generator providing a galvanically isolated current source to actuate said first and second MOSFETs when current is applied to light emitting diodes of said photovoltaic generator;
   means for gradually turning said light emitting diodes on and off to effect a gradual actuation and de-actuation of said solid state switches;
   contactless means for monitoring absolute position of said lighthead of the retractable light;
   at least one power supply to condition the electrical power from the vehicle to a level compatible with said control means; and
   at least one electrical filter to isolate electromagnetic interference between the vehicle and the solid state switching system.

13. A solid state switching system for a retractable vehicle light, comprising:
   means for controlling position of a lighthead and switching electrical power to a motor, motor brake, and lamp of the retractable light such that the power applied to said motor, motor brake, and lamp is gradually switched on and off and said control means switches said motor brake, motor, and lamp on and off in a synchronized fashion such that only one of said motor brake, motor, and lamp are switched on or off at any given time;
   solid state switches capable of switching high levels of AC or DC electrical voltage and current, said solid state switches comprising two N-Channel MOSFETs arranged in a series configuration such that a drain terminal of a first MOSFET is connected to electrical power, a drain terminal of a second MOSFET is connected to an electrical load to be switched, source terminals of said first and second MOSFETs are connected together, a photovoltaic generator is connected to gate terminals of said first and second MOSFETs, said photovoltaic generator providing a galvanically isolated current source to actuate said first and second MOSFETs when current is applied to light emitting diodes of said photovoltaic generator, said solid state switch having hysteresis means to prevent overlapping actuation of two or more solid state switches;

means for gradually turning said light emitting diodes on and off to effect a gradual actuation and de-actuation of said solid state switches;

contactless means for monitoring absolute position of said lighthead of the retractable light;

at least one power supply to condition the electrical power from the vehicle to a level compatible with said control means;

at least one electrical filter to isolate electromagnetic interference between the vehicle and the solid state switching system; and means for protecting said solid state switches from transient voltages.

14. A process for controlling a retractable vehicle light, comprising:

controlling position of a lighthead;

switching electrical power to a motor, motor brake, and lamp of the retractable light such that the power applied to said motor, motor brake, and lamp is gradually switched on and off; and providing solid state switches capable of switching high levels of AC or DC electrical voltage and current, said solid state switches comprising two N-Channel MOSFETs arranged in a series configuration such that a drain terminal of a first MOSFET is connected to electrical power, a drain terminal of a second MOSFET is connected to an electrical load to be switched, source terminals of said first and second MOSFETs are connected together, a photovoltaic generator is connected to gate terminals of said first and second MOSFETs, said photovoltaic generator providing a galvanically isolated current source to actuate said first and second MOSFETs when current is applied to light emitting diodes of said photovoltaic generator.

15. The process of claim 14, further comprising the step of monitoring absolute position of said lighthead of the retractable light with contactless means.

16. The process of claim 14, further comprising the step of gradually turning said light emitting diodes on and off to effect a gradual actuation and de-actuation of said solid state switches.

17. The process of claim 14, further comprising the step of switching said motor brake, motor, and lamp on and off in a synchronized fashion such that only one of said motor brake, motor, and lamp are switched on or off at any given time.

18. A process for controlling a retractable vehicle light, comprising:

controlling position of a lighthead;

switching electrical power to a motor, motor brake, and lamp of the retractable light such that the power applied to said motor, motor brake, and lamp is gradually switched on and off;

providing solid state switches capable of switching high levels of AC or DC electrical voltage and current, said solid state switches comprising two N-Channel MOSFETs arranged in a series configuration such that a drain terminal of a first MOSFET is connected to electrical power, a drain terminal of a second MOSFET is connected to an electrical load to be switched, source terminals of said first and second MOSFETs are connected together, a photovoltaic generator is connected to gate terminals of said first and second MOSFETs, said photovoltaic generator providing a galvanically isolated current source to actuate said first and second MOSFETs when current is applied to light emitting diodes of said photovoltaic generator;

conditioning the electrical power from the vehicle to a level compatible with said control;

isolating electromagnetic interference between the vehicle and the solid state switching system;

monitoring absolute position of a lighthead of the retractable light with contactless means; and gradually turning said light emitting diodes on and off to effect a gradual actuation and de-actuation of said solid state switches.

19. A process for controlling a retractable vehicle light, comprising:

controlling position of a lighthead;

switching electrical power to a motor, motor brake, and lamp of the retractable light such that the power applied to said motor, motor brake, and lamp is gradually switched on and off;

providing solid state switches capable of switching high levels of AC or DC electrical voltage and current, said solid state switches comprising two N-Channel MOSFETs arranged in a series configuration such that a drain terminal of a first MOSFET is connected to electrical power, a drain terminal of a second MOSFET is connected to an electrical load to be switched, source terminals of said first and second MOSFETs are connected together, a photovoltaic generator is connected to gate terminals of said first and second MOSFETs, said photovoltaic generator providing a galvanically isolated current source to actuate said first and second MOSFETs when current is applied to light emitting diodes of said photovoltaic generator;

conditioning the electrical power from the vehicle to a level compatible with said control;

isolating electromagnetic interference between the vehicle and the solid state switching system;

monitoring absolute position of a lighthead of the retractable light with a contactless encoder;

gradually turning said light emitting diodes on and off to effect a gradual actuation and de-actuation of said solid state switches;

switching said motor brake, motor, and lamp on and off in a synchronized fashion such that only one of said motor brake, motor, and lamp are switched on or off at any given time;

protecting said solid state switches from transient voltages; and activating said solid state switches to alert the vehicle crew when said lighthead is in an extended position.

* * * * *